United States Patent
Amblard et al.

(10) Patent No.: US 7,405,032 B1
(45) Date of Patent: Jul. 29, 2008

(54) COMBINATION OF NON-LITHOGRAPHIC SHRINK TECHNIQUES AND TRIM PROCESS FOR GATE FORMATION AND LINE-EDGE ROUGHNESS REDUCTION

(75) Inventors: Gilles Amblard, San Jose, CA (US); Srikanteswara Dakshina-Murthy, Wappingers Falls, NY (US); Bhanwar Singh, Morgan Hill, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 252 days.

(21) Appl. No.: 10/645,364

(22) Filed: Aug. 21, 2003

(51) Int. Cl.
*G01B 11/30* (2006.01)
*G01B 11/00* (2006.01)
*G03C 5/00* (2006.01)

(52) U.S. Cl. .................. 430/311; 430/322; 430/30; 430/330; 430/320; 356/636; 356/637; 356/625; 356/601

(58) Field of Classification Search .................. None
See application file for complete search history.

(56) References Cited

U.S. PATENT DOCUMENTS

| | | | | |
|---|---|---|---|---|
| 6,561,706 | B2 * | 5/2003 | Singh et al. | 396/611 |
| 6,650,422 | B2 * | 11/2003 | Singh et al. | 356/601 |
| 6,730,458 | B1 * | 5/2004 | Kim et al. | 430/296 |
| 6,905,949 | B2 * | 6/2005 | Arita | 438/551 |
| 7,064,846 | B1 * | 6/2006 | Amblard et al. | 356/636 |
| 7,159,205 | B1 * | 1/2007 | Amblard et al. | 716/19 |

\* cited by examiner

*Primary Examiner*—John A. McPherson
*Assistant Examiner*—Daborah Chacko Davis
(74) *Attorney, Agent, or Firm*—Amin, Turocy & Calvin, LLP

(57) ABSTRACT

The present invention relates generally to photolithographic systems and methods, and more particularly to systems and methodologies that facilitate the reduction of line-edge roughness (LER) during gate formation in an integrated circuit.

Systems and methods are disclosed for improving critical dimension (CD) of photoresist lines, comprising a non-lithographic shrink component that facilitates mitigating LER, and a trim etch component that facilitates achieving and/or restoring a target critical dimension.

21 Claims, 13 Drawing Sheets

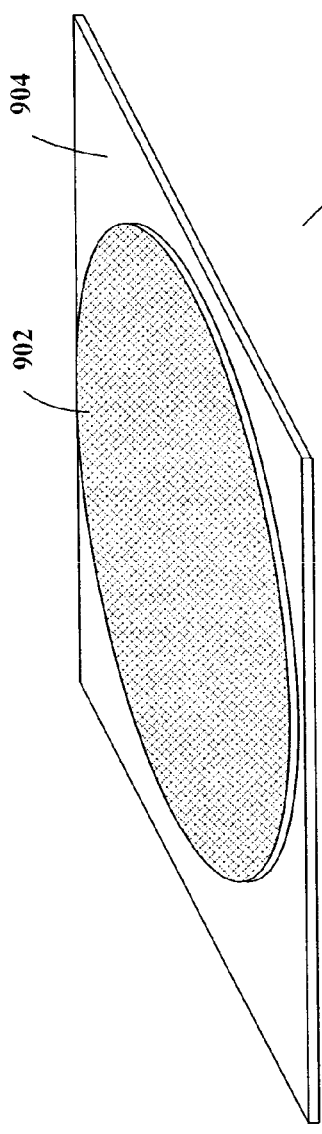
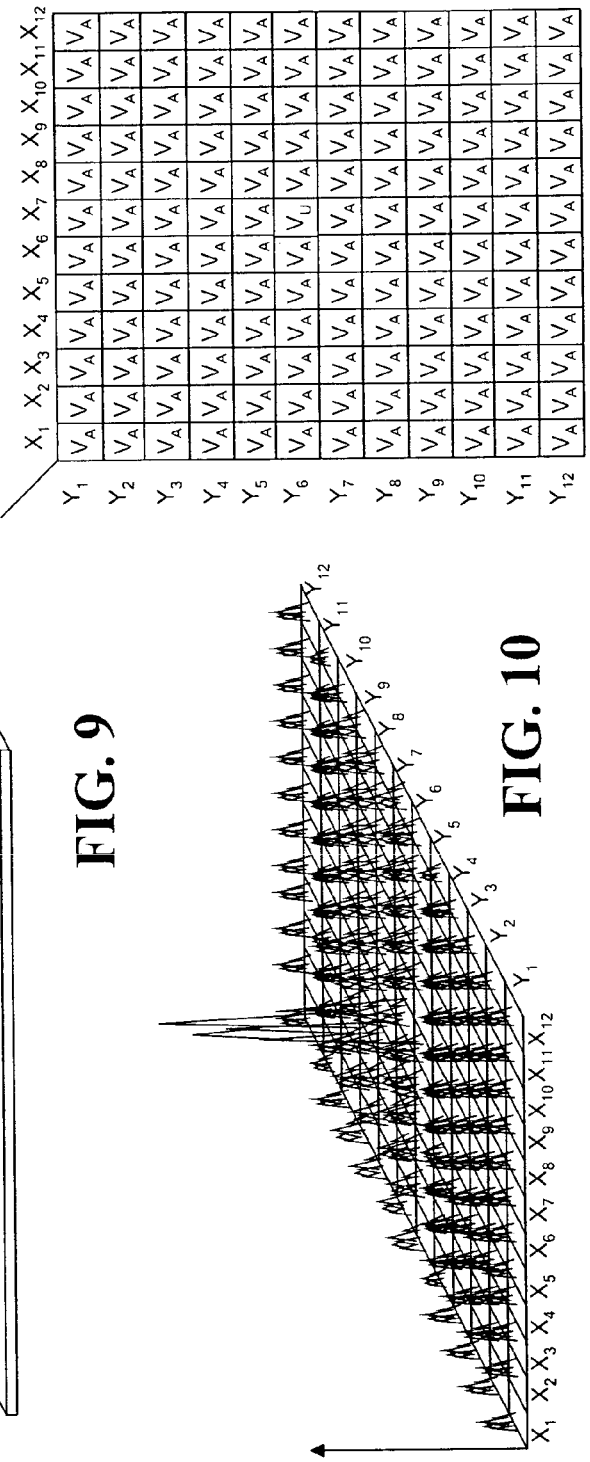
FIG. 9
FIG. 10
FIG. 11

COMBINATION OF NON-LITHOGRAPHIC SHRINK TECHNIQUES AND TRIM PROCESS FOR GATE FORMATION AND LINE-EDGE ROUGHNESS REDUCTION

TECHNICAL FIELD

The present invention relates generally to photolithographic systems and methods, and more particularly to systems and methodologies that facilitate mitigating line-edge roughness during gate formation in an integrated circuit.

BACKGROUND OF THE INVENTION

As semiconductor trends continue toward decreased size and increased packaging density, every aspect of semiconductor fabrication processes is scrutinized in an attempt to maximize efficiency in semiconductor fabrication and throughput. Many factors contribute to fabrication of a semiconductor. For example, at least one photolithographic process can be used during fabrication of a semiconductor. This particular factor in the fabrication process is highly scrutinized by the semiconductor industry in order to improve packaging density and precision in semiconductor structure.

Lithography is a process in semiconductor fabrication that generally relates to transfer of patterns between media. More specifically, lithography refers to a transfer of patterns onto a thin film that has been deposited onto a substrate. The transferred patterns then act as a blueprint for desired circuit components. Typically, various patterns are transferred to a photoresist (e.g., radiation-sensitive film), which overlies the thin film on the substrate during an imaging process described as "exposure" of the photoresist layer. During exposure, the photoresist is subjected to an illumination source (e.g. UV-light, electron beam, X-ray), which passes through a pattern template, or reticle, to print the desired pattern in the photoresist. Upon exposure to the illumination source, radiation-sensitive qualities of the photoresist permits a chemical transformation in exposed areas of the photoresist, which in turn alters the solubility of the photoresist in exposed areas relative to that of unexposed areas. When a particular solvent developer is applied, exposed areas of the photoresist are dissolved and removed, resulting in a three-dimensional pattern in the photoresist layer. This pattern is at least a portion of the semiconductor device that contributes to final function and structure of the device, or wafer.

Techniques, equipment and monitoring systems have concentrated on preventing and/or decreasing defect occurrence within lithography processes. For example, aspects of resist processes that are typically monitored can comprise: whether the correct mask has been used; whether resist film qualities are acceptable (e.g., whether resist is free from contamination, scratches, bubbles, striations, . . . ); whether image quality is adequate (e.g., good edge definition, line-width uniformity, and/or indications of bridging); whether critical dimensions are within specified tolerances; whether defect types and densities are recorded; and/or whether registration is within specified limits; etc. Such defect inspection task(s) have progressed into automated system(s) based on both automatic image processing and electrical signal processing.

Photoresist integrity must be maintained throughout the lithography process because any flaw or structural defect present on a patterned photoresist can be indelibly transferred to underlying layers during subsequent etch process(es) wherein the photoresist is employed. One example of an undesirable structural defect is line-edge roughness (LER). LER refers to variations on sidewalls of features, which can result from variations of LER in the patterned photoresist. Many factors can contributed to LER in the photoresist, such as LER on chrome patterns residing on the reticle, image contrast in a system that generates the photoresist pattern, a plasma etch process that can be used to pattern the photoresist, inherent properties and/or weaknesses of the photoresist materials, and/or the photoresist processing method. Additionally, LER appearing in fabricated structures can result from damage to the patterned photoresist during an etch process. Furthermore, the smaller the wavelength employed to expose a photoresist, the greater the deleterious effects of LER.

Current methods of gate line formation typically produce LER as an undesirable side effect. As lithographic techniques are pushed to their limits, smaller and smaller critical dimensions (CDs) are desired to maximize chip performance. Thus, chip manufacture is governed largely by wafer CD, which is defined as the smallest allowable width of, or space between, lines of circuitry in a semiconductor device. As methods of wafer manufacture are improved, wafer CD is decreased, which in turn requires finer and finer line edges to be produced. Line edges having a roughness that was acceptable just a year ago can detrimentally affect the performance of a chip exhibiting today's critical dimension standards. Thus, there exists a need in the art for systems and methods that can mitigate LER.

SUMMARY OF THE INVENTION

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to the more detailed description that is presented later.

The present invention provides for systems and methods that facilitate mitigation of line-edge roughness (LER) on gate lines formed in a photoresist during integrated circuit (IC) manufacture. An aspect of the present invention provides for a combination of techniques that can be employed to mitigate LER. For example, a monitoring component can determine whether LER exists on gate lines in a resist. If it is determined that LER is present, a non-lithographic shrink technique can be performed on gate line(s) to mitigate LER. If the non-lithographic shrink technique increases CD between gates, then the system can perform a trim etch to reduce the distance between gates to facilitate achieving a target CD.

According to one aspect, the non-lithographic shrink technique can be a thermal reflow technique, whereby a resist is heated to a predetermined temperature(s) so that the resist begins to exhibit fluid properties and begins to flow. By causing the resist to just enter a liquid phase, LER is mitigated because the solid physical state of the photoresist is compromised. After cooling, the resist can be trimmed via employing a trim etch technique to remove any material that may have flowed over the predelineated gate line boundary. In this manner, the invention advantageously mitigates LER while maintaining critical dimension within a desired tolerance.

According to another aspect, the invention can employ a Resolution Enhancement Lithography Assisted by Chemical Shrink (RELACS™) technique. For example, contact holes and/or gate channels can be shrunk to facilitate achieving Deep UV and/or Extreme UV dimensions. According to yet another aspect of the invention, a Shrink Assist Film for Enhanced Resolution (SAFIER) technique can be employed to facilitate a controlled shrink of, for example, a contact opening or a gate channel. This technique is capable of shrinking a contact opening down to about 50 nm.

To the accomplishment of the foregoing and related ends, certain illustrative aspects of the invention are described herein in connection with the following description and the annexed drawings. These aspects are indicative, however, of but a few of the various ways in which the principles of the invention can be employed and the present invention is intended to comprise all such aspects and their equivalents. Other advantages and novel features of the invention will become apparent from the following detailed description of the invention when considered in conjunction with the drawings.

BRIEF DESCRIPTION OF THE DRAWINGS

FIG. 5b is a top-down illustration of a wafer with gate lines exhibiting LER presented to permit comparison with the cross-sectional view of the wafer of 5a.

FIG. 7b is a top-down illustration of a wafer with gate lines where LER has been mitigated, presented to permit comparison with the cross-sectional view of the wafer of 7a.

FIG. 9 illustrates a perspective view of a grid-mapped wafer according to one or more aspects of the present invention.

FIG. 10 illustrates plots of measurements taken at grid-mapped locations on a wafer in accordance with one or more aspects of the present invention.

FIG. 11 illustrates a table containing entries corresponding to measurements taken at respective grid-mapped locations on a wafer in accordance with one or more aspects of the present invention.

DETAILED DESCRIPTION OF THE INVENTION

Figure 1:
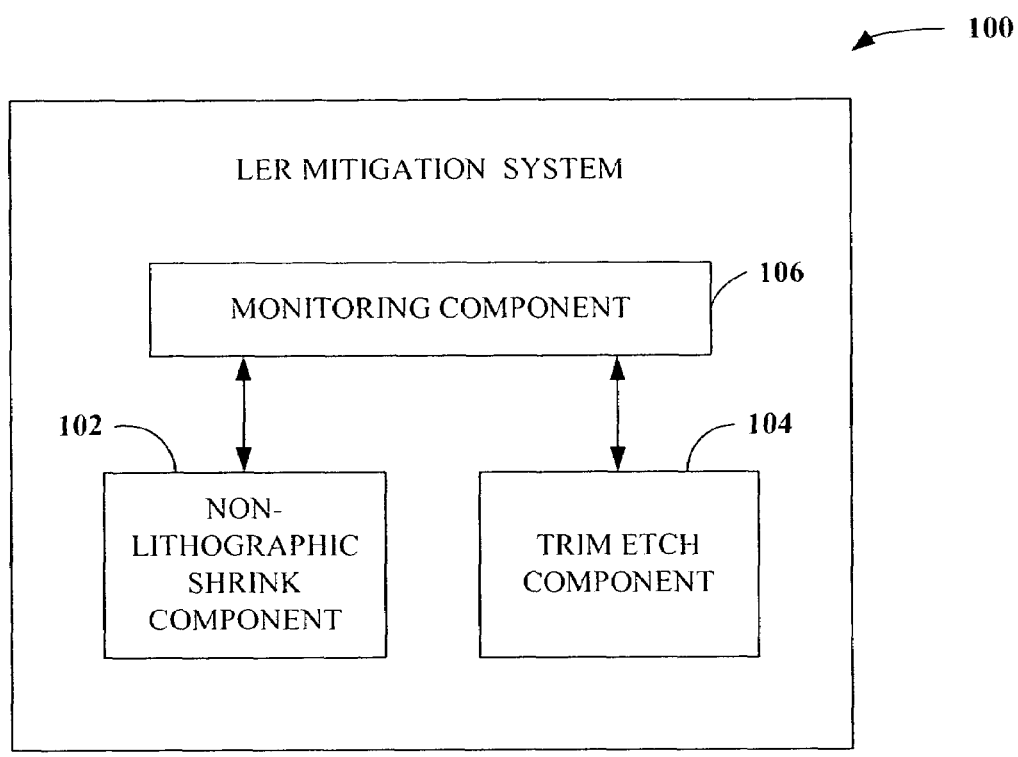
FIG. 1 is an illustration of a system in accordance with an aspect of the present invention.

The present invention will now be described with reference to the drawings, wherein like reference numerals are used to refer to like elements throughout. The present invention will be described with reference to systems and methods for mitigating line-edge roughness (LER) during gate formation while maintaining critical dimension (CD) within a target tolerance. It should be understood that the description of these exemplary aspects are merely illustrative and that they should not be taken in a limiting sense.

The term "component" refers to a computer-related entity, either hardware, a combination of hardware and software, software, or software in execution. For example, a component can be a process running on a processor, a processor, an object, an executable, a thread of execution, a program and a computer. By way of illustration, both an application running on a server and the server can be components. A component can reside in one physical location (e.g., in one computer) and/or can be distributed between two or more cooperating locations (e.g., parallel processing computer, computer network).

It is to be appreciated that various aspects of the present invention can employ technologies associated with facilitating unconstrained optimization and/or minimization of error costs. Thus, non-linear training systems/methodologies (e.g., back propagation, Bayesian, fuzzy sets, non-linear regression, or other neural networking paradigms including mixture of experts, cerebella model arithmetic computer (CMACS), radial basis functions, directed search networks, and function link networks) can be employed.

FIG. 1 is an illustration of an LER mitigation system 100 according to an aspect of the present invention. The LER mitigation system 100 comprises a non-lithographic shrink component 102 and a trim etch component 104, each of which is operatively coupled to a monitoring component 106. According to an aspect of the invention, gate lines are formed in photoresist via conventional methods. The monitoring component 106 can analyze and determine whether threshold LER exists on the gate lines, and/or whether CD is within a target tolerance. The monitoring component 106 can employ scatterometry techniques to perform the preceding analysis.

It is to be appreciated that the monitoring component 106 can be, for example, a scatterometry component. The present invention contemplates any suitable scatterometry component and/or system, and such systems are intended to fall within the scope of the hereto-appended claims. It is further to be appreciated that the monitoring component 106 utilized by the present invention can be, for example, a Scanning Electron Microscope (SEM), a Critical Dimension Scanning Electron Microscope (CD-SEM), a Field Effect Scanning Electron Microscope (FESEM), an In-Lens FESEM, or a Semi-In-Lens FESEM, depending on the desired magnification and precision. For example, FESEM permits greater levels of magnification and resolution at high or low energy levels by rastering a narrower electron beam over the sample area. FESEM thus permits quality resolution at approximately 1.5 nm. Because FESEM can produce high-quality images at a wide range of accelerating voltages (typically 0.5 kV to 30 kV), it is able to do so without inducing extensive electrical charge in the sample. Furthermore, conventional SEM cannot accurately image an insulating material unless the material is first coated with an electrically conductive material. FESEM mitigates the need for the deposit of an electrically conductive coating prior to scanning. According to another example, the monitoring component 106 of the present invention can be In-Lens FESEM, which is capable 0.5 nm resolution at an accelerating voltage of 30 kV, or any other suitable type of scanner, such as Transmission Electron Microscopy (TEM), Atomic Force Microscopy (AFM), Scanning Probe Microscopy (SPM), etc.

It is further to be appreciated that information gathered by the monitoring component 106 can be utilized for generating feedback and/or feed-forward data that can facilitate achieving critical dimensions that are within acceptable tolerances. The LER mitigation system 100 can additionally employ such data to control components and/or operating parameters associated therewith. For instance, feedback/feed-forward information can be generated from sequence analysis to maintain, increase and/or decrease a rate at which fabrication processes (e.g., thermal reflow, etching, . . . ) progress. For example, one or more etchant formulae and/or concentrations can be altered to affect an etching rate based on sequence analysis data.

Upon determining that a threshold amount of LER is present, the system 100 can mitigate LER by employing the non-lithographic shrink component 102. To compensate for any deviation in CD associated with a non-lithographic shrink technique, the present system can subsequently perform a trim etch to reduce CD to a pre-determined target value via employing the trim etch component 104. Thus, the instant invention can advantageously mitigate LER associated with gate line formation while preserving a desired CD.

According to an aspect of the invention, the non-lithographic shrink component 102 can be a thermal reflow component that is capable of heating a resist (not shown) in which gate lines have been formed to a temperature at which the resist will begin to flow. By causing the resist to begin to flow, jagged edges associated with LER can be smoothed (e.g., mitigated). Additionally, the non-lithographic shrink component 102 can be a Resolution Enhancement Lithography Assisted by Chemical Shrink (RELACS™) component. For example, contact holes and/or gate channels can be shrunk to facilitate achieving Deep UV and/or Extreme UV dimensions. According to another example, the non-lithographic shrink component 102 can be a Shrink Assist Film for Enhanced Resolution (SAFIER) component that can facilitate a controlled shrink of, for example, a contact opening or a gate channel. Via employing a SAFIER technique, a SAFIER component can shrink a contact opening down to about 50 nm.

It is to be understood that discussion herein pertaining to a "trim etch component" and/or a "trim etch technique" is intended to embrace any suitable trim etch component, system, and/or technique and any and all associated components (e.g., a trim etch reticle or photomask, etchant/solvent, exposure source, . . . ). According to one example, the trim etch component 104 can comprise a cleaving compound (not shown) that effects a chemical interaction within portions of the photoresist adjacent to the trim etch component 104, thus forming a thin, unprotected resist layer within the resist. The cleaving compound can diffuse into a thin portion of the resist adjacent to the coating. The cleaving compound(s) at or near the interface of the trim etch component 104 and the resist can induce a chemical transformation whereby labile groups of the resist polymer can be cleaved and/or unprotected, thus making the cleaved and/or unprotected portions of the resist susceptible to removal via the introduction of an appropriate solvent and/or developer.

To further this example, the trim etch component 104 can apply a trimming compound(s) (e.g. an acidic gas, a basic gas, an acidic solution, a basic solution, . . . ) that is capable of diffusing into the top and side portions of resist structures. The trimming compound(s) increase the solubility of the diffused portions of the resist, which facilitates creating smaller features, such as gate lines.

Figure 2:
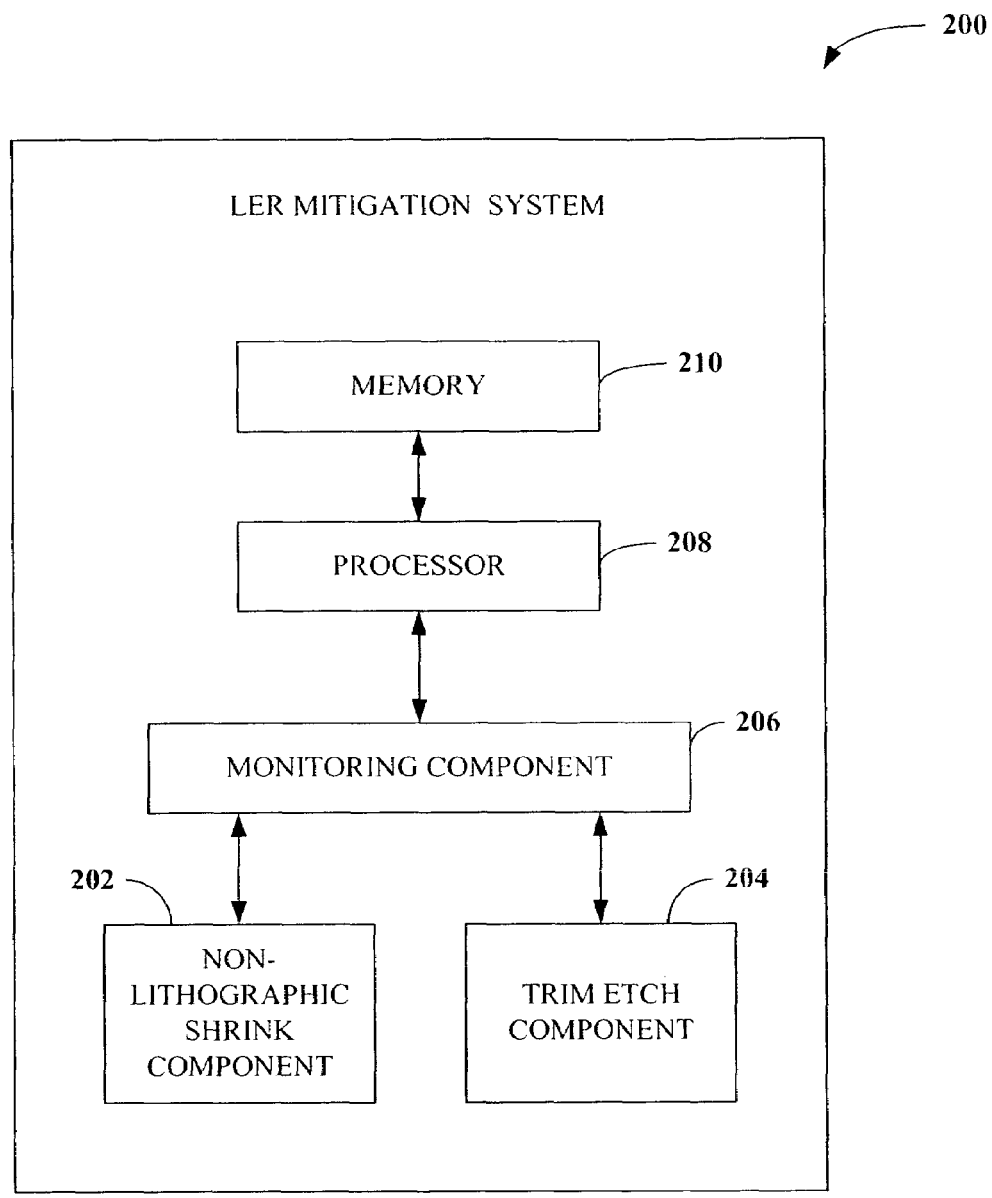
FIG. 2 is an illustration of a system in accordance with an aspect of the present invention comprising a processor and a memory.

FIG. 2 illustrates an LER mitigation system 200 in accordance with an aspect of the present invention. The LER mitigation system 200 comprises a non-lithographic shrink component 202 and a trim etch component 204, both of which are operably coupled to a monitoring component 206. According to this aspect, the monitoring component 206 is further operably coupled to a processor 208, which is in turn operably coupled to a memory 210. It is to be understood that a that the processor 208 can be a processor dedicated to determining whether LER exists, a processor used to control one or more of the components of the present system(s), or, alternatively, a processor that is both used to determine whether LER exists and to control one or more of the components of the LER mitigation system.

The memory component 210 can be employed to retain control programs, semiconductor fabrication data, etc. Furthermore, the memory 210 can be either volatile memory or nonvolatile memory, or can comprise both volatile and non-volatile memory. By way of illustration, and not limitation, nonvolatile memory can comprise read only memory (ROM), programmable ROM (PROM), electrically programmable ROM (EPROM), electrically erasable ROM (EEPROM), or flash memory. Volatile memory can comprise random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). The memory 210 of the present systems and methods is intended to comprise, without being limited to, these and any other suitable types of memory.

Figure 3:
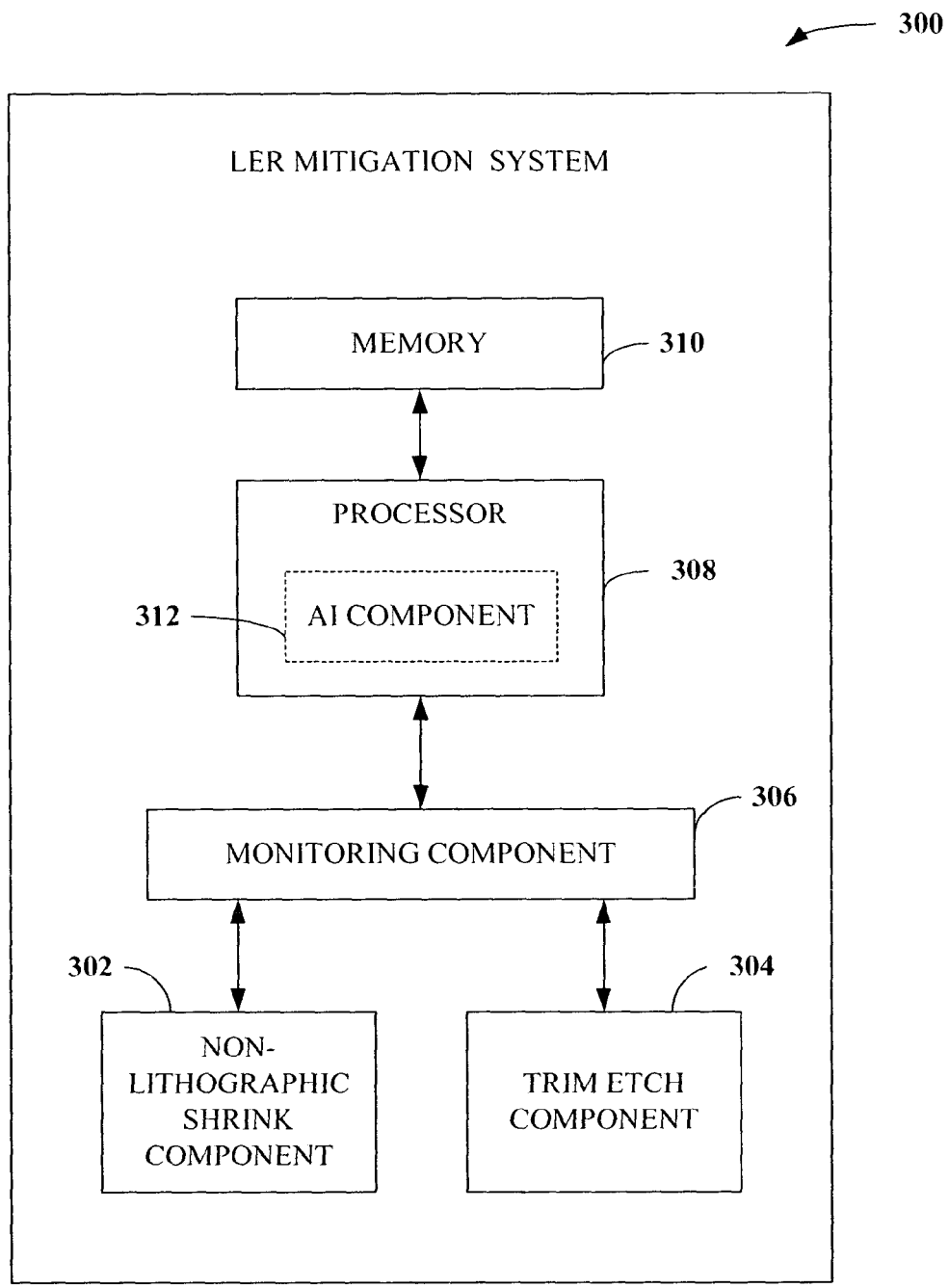
FIG. 3 is an illustration of a system in accordance with the present invention wherein a processor comprises an artificial intelligence component.

FIG. 3 is an illustration of an LER mitigation system 300 in accordance with an aspect of the present invention. The LER mitigation system 300 can employ various inference schemes and/or techniques in connection with mitigating LER and reclaiming a target CD. As used herein, the term "inference" refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources. Various classification schemes and/or systems (e.g., support vector machines, neural networks, expert systems, Bayesian belief networks, fuzzy logic, data fusion engines . . . ) can be employed in connection with performing automatic and/or inferred action in connection with the subject invention.

Still referring to FIG. 3, the LER mitigation system 300 comprises a non-lithographic shrink component 302 and a trim etch component 304, which are operably coupled to a monitoring component 306. A processor 308 is operably coupled to both a memory 310 and the monitoring component 306. According to this aspect of the invention, the processor 308 is associated with an artificial intelligence (AI) component 312 that can make inferences regarding system operation. For example, the AI component 312 can determine an optimal duration for employing the non-lithographic shrink component 302, the trim etch component 304, or both. According to another example, the AI component 312 can make inferences regarding whether target CD has been achieved or whether a second trim etch is necessary to achieve target CD. These examples are given by way of illustration only and are not in any way intended to limit the scope of the present invention or the number of, or manner in which the AI component makes, inferences.

Figure 4A:
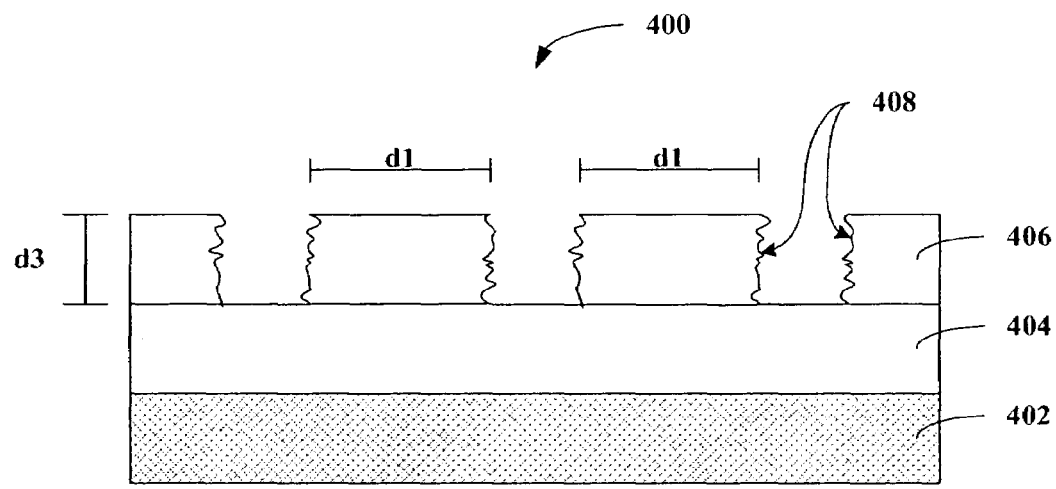
FIG. 4a is a cross-sectional illustration of a wafer with gate lines exhibiting line-edge roughness (LER).

FIG. 4a is a cross-sectional illustration of a wafer 400 with extant gate lines exhibiting LER. The wafer 400 comprises a silicon or polysilicon substrate 402, at least one layer of dielectric material 404 overlying the substrate 402, and a photoresist layer 406 overlying the at least one dielectric layer 404. The at least one dielectric layer can be, for example, a silicon carbonitride layer (SiCN), a silicon oxycarbide layer (SiOC:H), a silicon dioxide layer ($SiO_2$), and a silicon oxynitride layer (SiON). However, it is to be understood that the structure can comprise at least one dielectric layer and one or more dielectric layers, which may or may not be arranged in the order described above. The photoresist layer 406 can be, for example, a short wavelength photoresist layer that has been patterned with an image corresponding to a gate formation utilizing 193 nm or less radiation. An image can be patterned on the photoresist layer 406 utilizing short wavelength radiation, thereby exposing portions of the dielectric layer 404. Short wavelength radiation specifically comprises about 193 nm light and about 157 nm light or less. The image can, for example, correspond to one or more trenches and/or gates. The photoresist layer 406 has gate lines exhibiting LER 408.

FIG. 4a also illustrates a distance d1, which is the CD measurement between pairs of gate lines. For purposes of this discussion, d1 represents a desired target CD. Another distance is represented as d3, which delineates the initial thickness of the photoresist. This aspect of the invention contemplates a photoresist thickness of between approximately 500 angstroms and approximately 5000 angstroms.

Figure 4B:
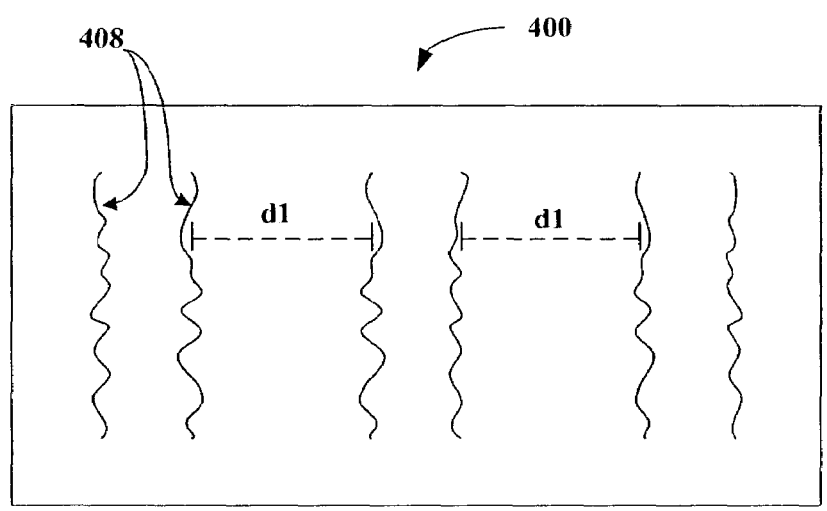
FIG. 4b is a top-down illustration of a wafer with gate lines exhibiting LER.

FIG. 4b is a top-down illustration of a wafer 400. Resist lines 408 are shown as having been formed utilizing a standard process wherein modern lithographic limits are approached. For example, the gate lines 408 can be formed via utilizing an ArF (153 nm) resist. The gates delineated by each pair of gate lines 408 have an associated CD described by the distance d1, where d1 is the target or desired distance between gates. The gate lines 408 further illustrate LER associated with typical gate formation techniques.

It is to be appreciated that the gate lines 408 can exhibit LER in both of an x-plane and a y-plane. For example, LER can exist on a line edge in the y-plane, as illustrated by the cross-sectional view of the gate lines 408, and/or in the x-plane as shown by the top-down view of the gate lines 408. It is further to be appreciated that LER can potentially occur in any plane depending on the particular geometry of an object delineated by resist lines.

Figure 5A:
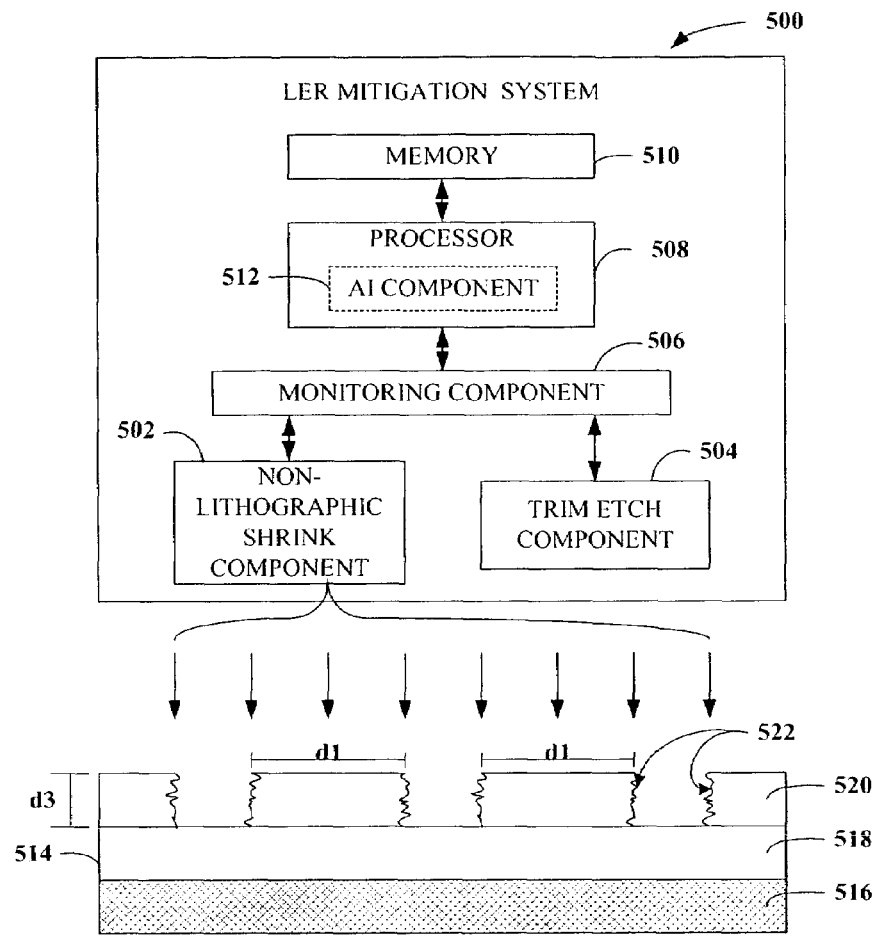
FIG. 5a is an illustration of a system in accordance with an aspect of the present invention wherein a non-lithographic shrink technique is applied to mitigate LER.

FIG. 5a is an illustration of a wafer as described in FIG. 4 undergoing a non-lithographic shrink technique via an LER mitigation system 500. This aspect of the invention contemplates thermal reflow techniques, SAFIER techniques, and/or RELACS™ techniques. However, the invention is not limited to the above-mentioned techniques, and can employ any suitable non-lithographic shrink technique. The LER mitigation system 500 comprises a non-lithographic shrink technique component 502 and a trim etch component 504. Both the shrink component 502 and the trim etch component 504 are operably coupled to a monitoring system 506. A processor 508 is operably coupled to a memory 510 and to the monitoring component 506. The processor 508 is associated with an AI component 512 that can make inferences regarding various aspects of LER mitigation.

Still referring to FIG. 5, the LER mitigation system 500 directs the shrink component 502 to perform a shrink technique on a wafer 514. The performance of the technique is illustrated via solid arrows. The wafer 514 comprises a silicon or polysilicon substrate 516, at least one layer of dielectric material 518 overlying the substrate 516, and a photoresist layer 520 overlying the at least one dielectric layer 518. The at least one dielectric layer can be, for example, a silicon carbonitride layer (SiCN), a silicon oxycarbide layer (SiOC:H), a silicon dioxide layer ($SiO_2$), and a silicon oxynitride layer (SiON). However, it is to be understood that the structure can comprise at least one dielectric layer and one or more dielectric layers, which may or may not be arranged in the order described above. Furthermore, the present invention contemplates utilizing any suitable material for the at least one dielectric layer. As described with respect to FIG. 4, the photoresist layer 520 can be, for example, a short wavelength photoresist layer that has been patterned with an image corresponding to a gate formation utilizing 193 nm or less radiation. A distance d1 is shown, which is the CD measurement between gate lines. For purposes of this discussion, d1 represents the desired target CD. Another distance is represented as d3, which delineates the initial thickness of the photoresist. Furthermore, gate lines exhibiting LER 522 are illustrated as delineating the target CD, as defined by the distance d1.

Figure 5B:
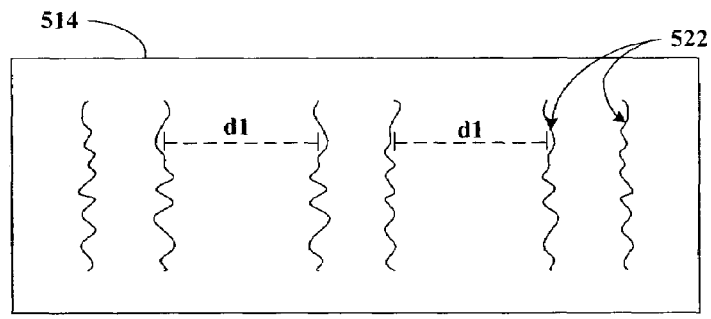

FIG. 5b is a top-down illustration of the wafer 514 with resist lines 522 exhibiting LER. FIG. 5b is presented in conjunction with FIG. 5a to permit a comparison with the cross-sectional view of the wafer 514 illustrated in FIG. 5a in order to facilitate an understanding that the gate lines 522 can exhibit LER in one or both of an x-plane and a y-plane.

Figure 6A:
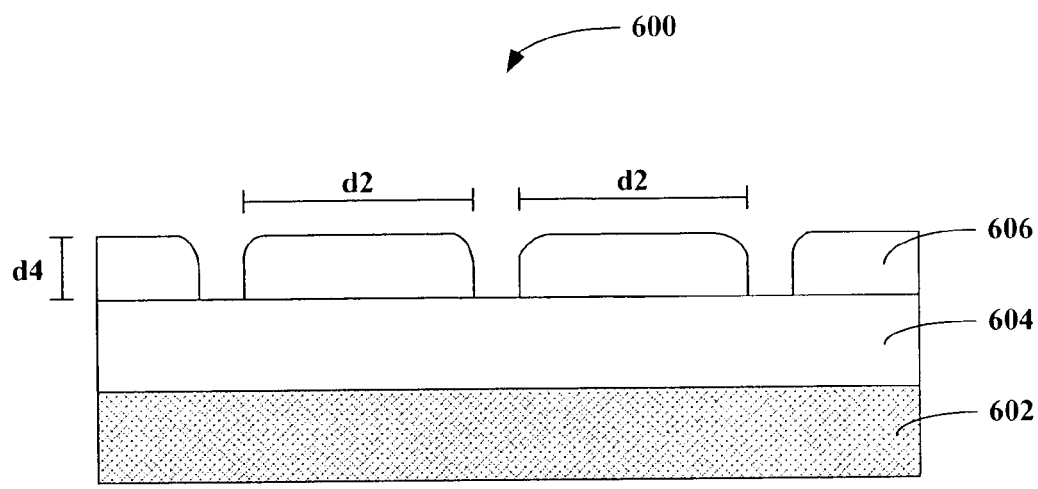
FIG. 6a is an illustration of a wafer after application of a non-lithographic shrink technique.

FIG. 6a illustrates a cross-sectional view of a wafer 600 after an LER mitigation system has performed a non-lithographic shrink technique. According to this illustration, LER has been mitigated on gate lines 608. The wafer 600 comprises a silicon or polysilicon substrate 602, at least one layer of dielectric material 604 overlying the substrate 602, and a photoresist layer 606 overlying the at least one dielectric layer 604. In the process of mitigating LER, it should be noted that the original target CD (originally defined by d1) can increase to d2, as a potentially inherent property associated with employing a particular shrink technique. For example, when a shrink technique is employed, the distance between edges that delineate a gate width can be reduced, resulting in shrinkage of gate width, which in turn can necessarily cause an increase in the distance between gates (e.g., illustrated by d2). A further potential change in physical parameters of the photoresist layer 606 is illustrated by d4, whereby it is shown that the thickness of the photoresist layer 606 can be reduced as a function of the increase in CD between gates. Thus, as d1 increases to d2, d3 (original thickness of a photoresist) can decrease to d4.

Figure 6B:
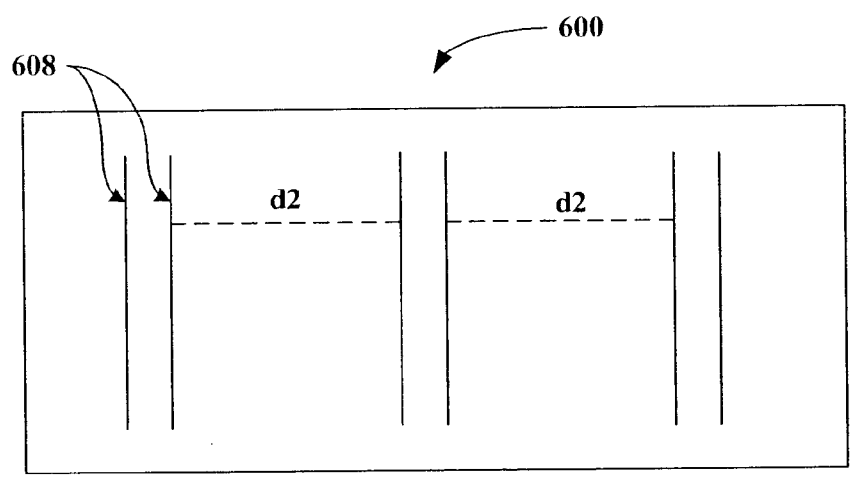
FIG. 6b is a top-down illustration of a wafer with gate lines where LER has been mitigated and critical dimension (CD) has increased.

FIG. 6b is a top-down illustration of a wafer having gate lines wherein LER has been mitigated via employing a non-lithographic shrink technique. The resist lines 608 further illustrate an increased CD, d2, which can occur after a shrink technique has been employed. FIG. 6b is presented in conjunction with FIG. 6a to permit a comparison with the cross-sectional view of the wafer 600 illustrated in FIG. 6a.

Figure 7A:
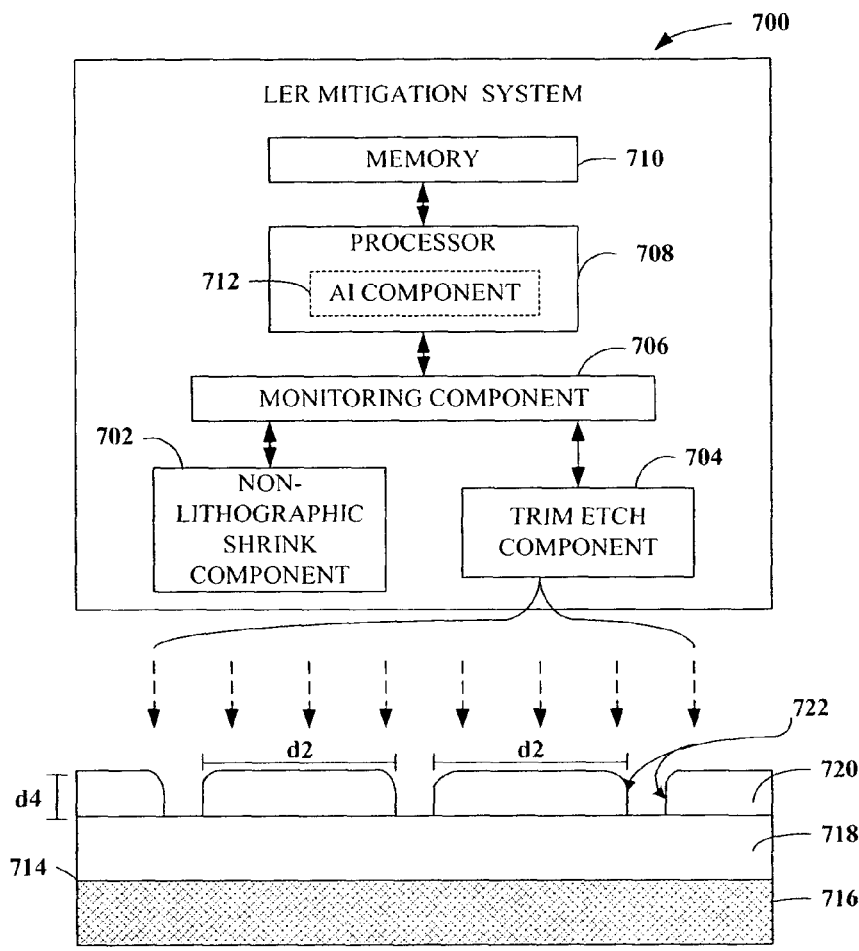
FIG. 7a is an illustration of a system in accordance with an aspect of the present invention wherein a trim etch is applied to achieve a target critical dimension.

FIG. 7a is an illustration of an LER mitigation system 700 performing a trim etch on a wafer 714 (shown in cross-section) in accordance with an aspect of the invention. The LER mitigation system 700 comprises a non-lithographic shrink technique component 702 and a trim etch component 704. Both the shrink component 702 and the trim etch component 704 are operably coupled to a monitoring system 706. A processor 708 is operably coupled to a memory 710 and to the monitoring component 706. The processor 708 is associated with an AI component 712 that can make inferences regarding various aspects of LER mitigation. For example, the AI component 712 can infer a proper duration of, and/or target CD for, a trim etch technique based on information associated with, for instance, CD as defined by d2 (post-shrink CD).

The wafer 714 comprises a silicon or polysilicon substrate 716, at least one layer of dielectric material 718 overlying the substrate 716, and a photoresist layer 720 overlying the at least one dielectric layer 718. It is to be appreciated that the at least one dielectric layer 718 can be any suitable dielectric material(s), including but not limited to the dielectric materials described herein supra. It is further to be appreciated that the at least one dielectric layer 718 can be one or a plurality of dielectric layers. Performance of the trim etch technique upon the wafer 714 is illustrated by hashed arrows. It is to be noted that the photoresist layer 720 has gate lines 722 that no longer exhibit significant LER.

Figure 7B:
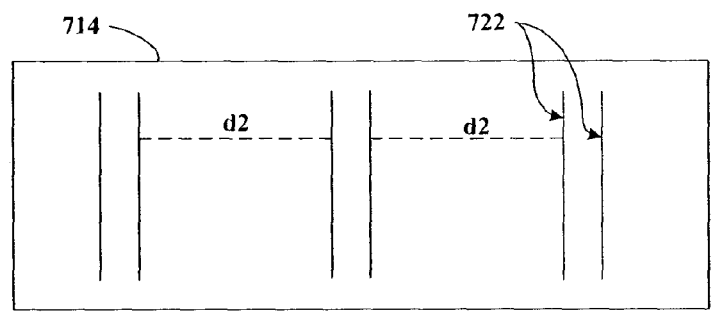

FIG. 7b is a top-down illustration of the wafer 714 with resist lines 722 wherein LER has been mitigated. FIG. 7b is presented in conjunction with FIG. 7a to permit a comparison with the cross-sectional view of the wafer 714 illustrated in FIG. 7a in order to facilitate an understanding that the gate lines 722 can exhibit an increased CD, d2, there between as a result of mitigating LER via employing a shrink technique.

Figure 8A:
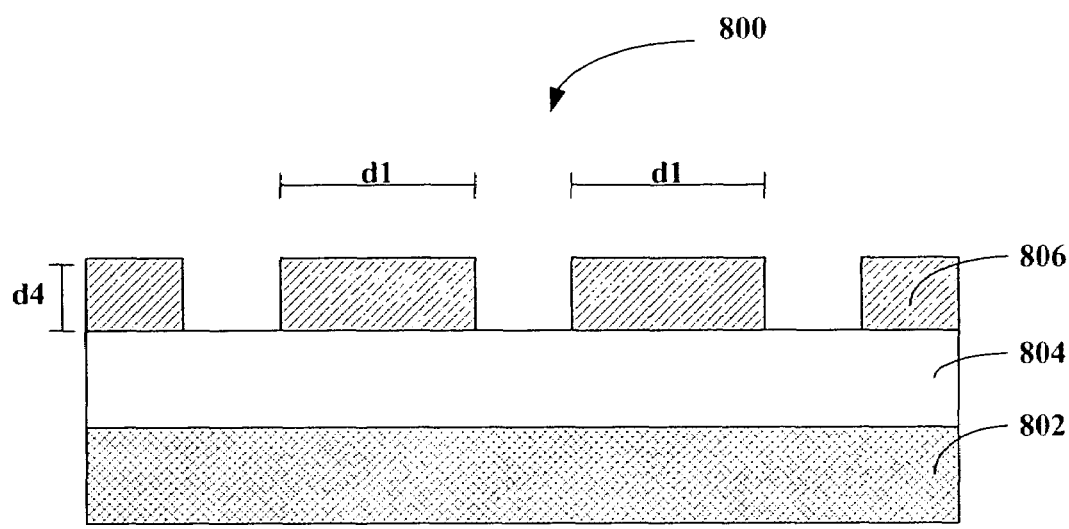
FIG. 8a is an illustration of a wafer having a desired critical dimension after a trim etch technique has been applied.

FIG. 8a is an illustration of a cross-section of a wafer 800 wherein an original target CD has been recaptured. The wafer 800 comprises a silicon or polysilicon substrate 802, at least one layer of dielectric material 804 overlying the substrate 802, and a photoresist layer 806 overlying the at least one dielectric layer 804. The wafer 800 has gate lines 808 that have no LER. Furthermore the original CD, d1, has been restored so that the distance between gates is within a target tolerance.

Figure 8B:
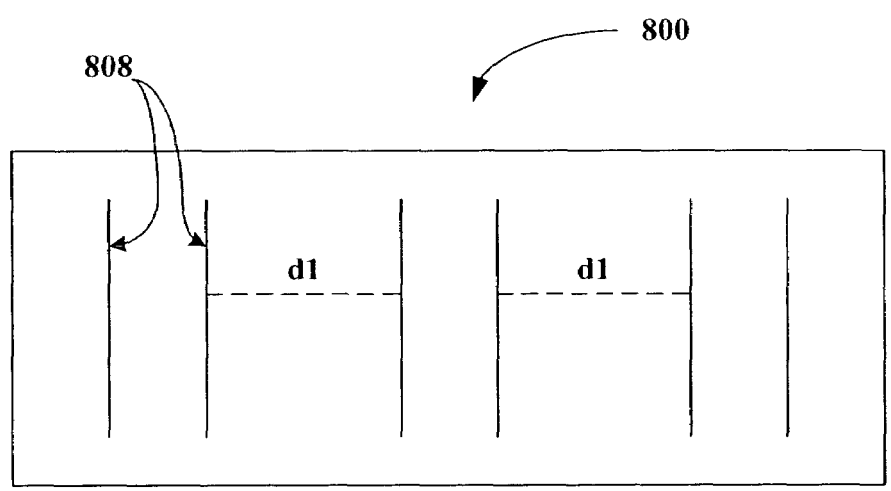
FIG. 8b is a top-down illustration of a wafer with gate lines where LER has been mitigated and target CD has been restored.

FIG. 8b is a top-down illustration of a wafer 800 having gate lines wherein LER has been mitigated via employing a non-lithographic shrink technique. The resist lines 808 further illustrate the original target CD, d1, which has been recaptured via employing the trim etch. FIG. 8b is presented in conjunction with FIG. 8a to permit a comparison with the cross-sectional view of the wafer 800 illustrated in FIG. 8a.

Turning now to FIGS. 9-11, in accordance with one or more aspects of the present invention, a wafer 902 (or one or more die located thereon) situated on a stage 904 can be logically partitioned into grid blocks to facilitate concurrent measurements of critical dimensions and overlay as the wafer matriculates through a semiconductor fabrication process. This can facilitate selectively determining to what extent, if any, fabrication adjustments are necessary. Obtaining such information can also assist in determining problem areas associated with fabrication processes.

FIG. 9 illustrates a perspective view of a steppable stage 904 supporting a wafer 902. The wafer 902 can be divided into a grid pattern as shown in FIG. 10. Each grid block (XY) of the grid pattern corresponds to a particular portion of the wafer 902 (e.g., a die or a portion of a die). The grid blocks are individually monitored for fabrication progress by concurrently measuring critical dimensions and overlay with either scatterometry or scanning electron microscope (SEM) techniques.

This can also be applicable in order to assess wafer-to-wafer and lot-to-lot variations. For example, a portion P (not shown) of a first wafer (not shown) can be compared to the corresponding portion P (not shown) of a second wafer. Thus, deviations between wafers and lots can be determined in order to calculate adjustments to the fabrication components that are necessary to accommodate for the wafer-to-wafer and/or lot-to-lot variations.

In FIG. 10, one or more respective portions of a wafer 902 ($X_1Y_1 \ldots X_{12}, Y_{12}$) are concurrently monitored for critical dimensions and overlay utilizing either scatterometry or scanning electron microscope techniques. Exemplary measurements produced during fabrication for each grid block are illustrated as respective plots. The plots can, for example, be composite valuations of signatures of critical dimensions and overlay. Alternatively, critical dimensions and overlay values can be compared separately to their respective tolerance limits.

As can be seen, the measurement at coordinate $X_7Y_6$ yields a plot that is substantially higher than the measurement of the other portions XY. This can be indicative of overlay, overlay error, and/or one or more critical dimension(s) outside of acceptable tolerances. As such, fabrication components and/or operating parameters associated therewith can be adjusted accordingly to mitigate repetition of this aberrational measurement. It is to be appreciated that the wafer 902 and or one or more die located thereon can be mapped into any suitable number and/or arrangement of grid blocks to effect desired monitoring and control.

FIG. 11 is a representative table of concurrently measured critical dimensions and overlay taken at various portions of the wafer 902 mapped to respective grid blocks. The measurements in the table can, for example, be amalgams of respective critical dimension and overlay signatures. As can be seen, all the grid blocks, except grid block $X_7Y_6$, have measurement values corresponding to an acceptable value ($V_A$) (e.g., no overlay error is indicated and/or overlay measurements and critical dimensions are within acceptable tolerances), while grid block $X_7Y_6$ has an undesired value ($V_U$) (e.g., overlay and critical dimensions are not within acceptable tolerances, thus at least an overlay or CD error exists). Thus, it has been determined that an undesirable fabrication condition exists at the portion of the wafer 902 mapped by grid block $X_7Y_6$. Accordingly, fabrication process components and parameters can be adjusted as described herein to adapt the fabrication process accordingly to mitigate the re-occurrence or exaggeration of this unacceptable condition.

Alternatively, a sufficient number of grid blocks can have desirable thickness measurements so that the single offensive grid block does not warrant scrapping the entire wafer. It is to be appreciated that fabrication process parameters can be adapted so as to maintain, increase, decrease and/or qualitatively change the fabrication of the respective portions of the wafer 902 as desired. For example, when the fabrication process has reached a pre-determined threshold level (e.g., X % of grid blocks have acceptable CDs and no overlay error exists), a fabrication step can be terminated.

Figure 12:
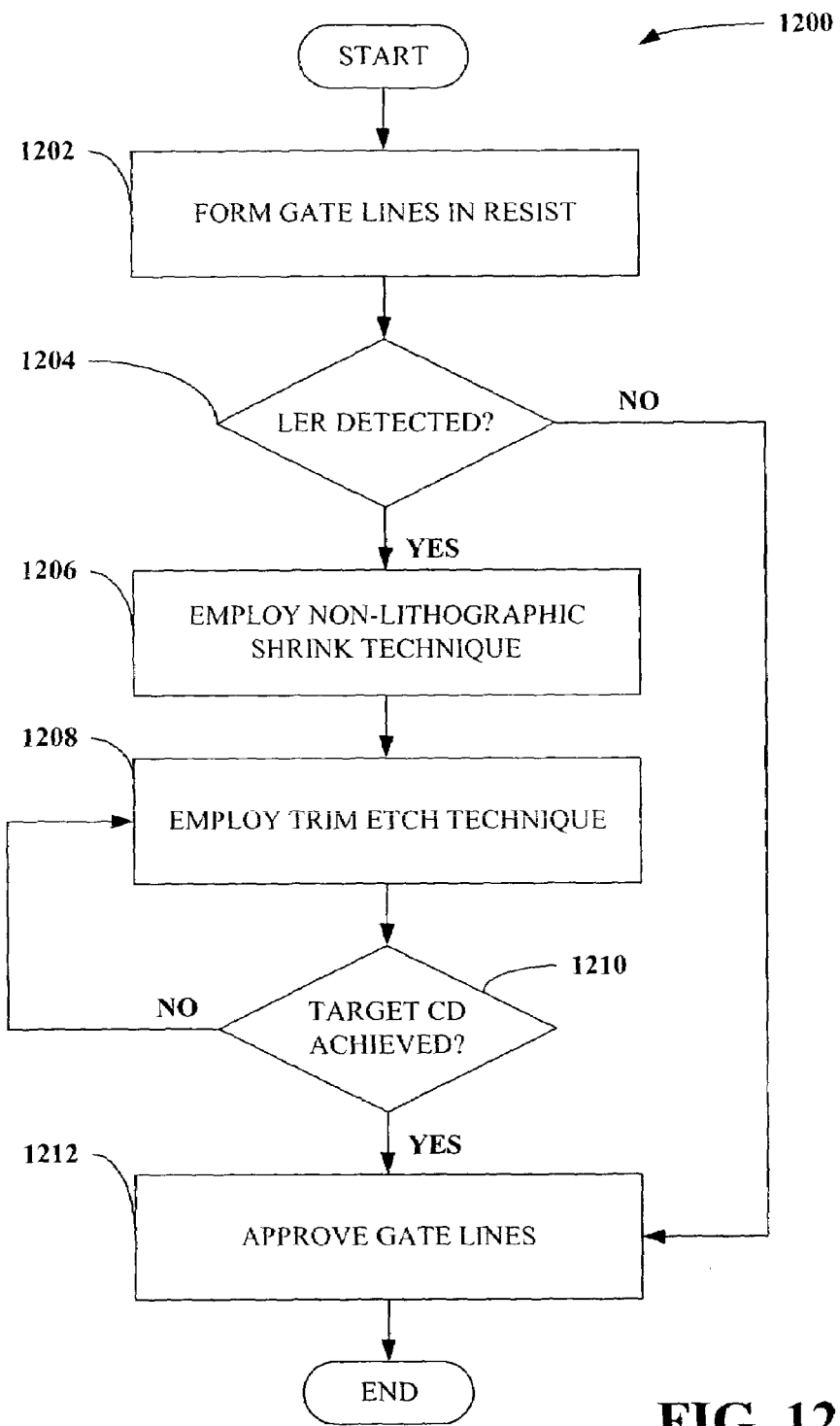
FIG. 12 is an illustration of a flow diagram of a methodology in accordance with an aspect of the present invention.
Figure 13:
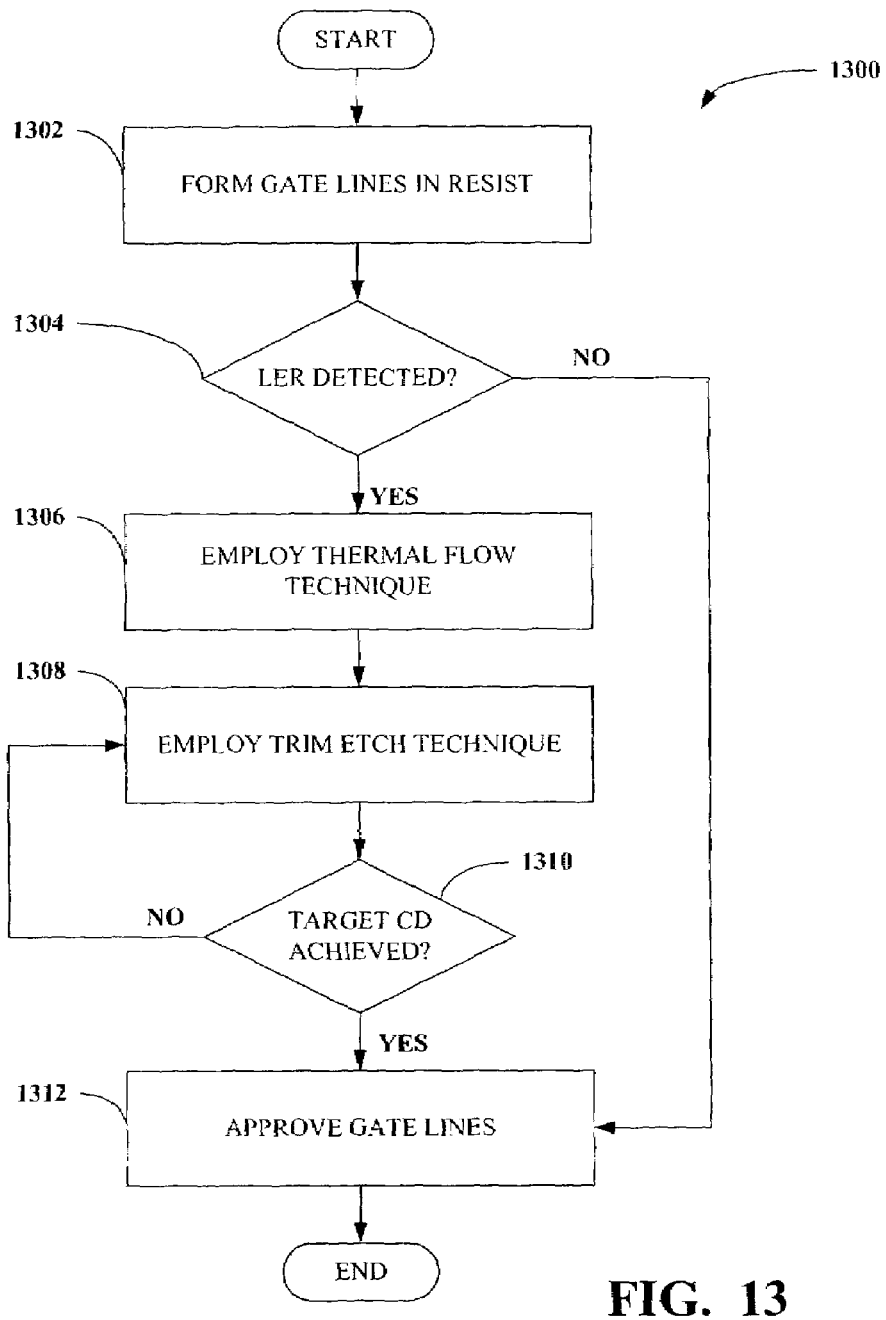
FIG. 13 is an illustration of a flow diagram of a methodology in accordance with an aspect of the present invention.
Figure 14:
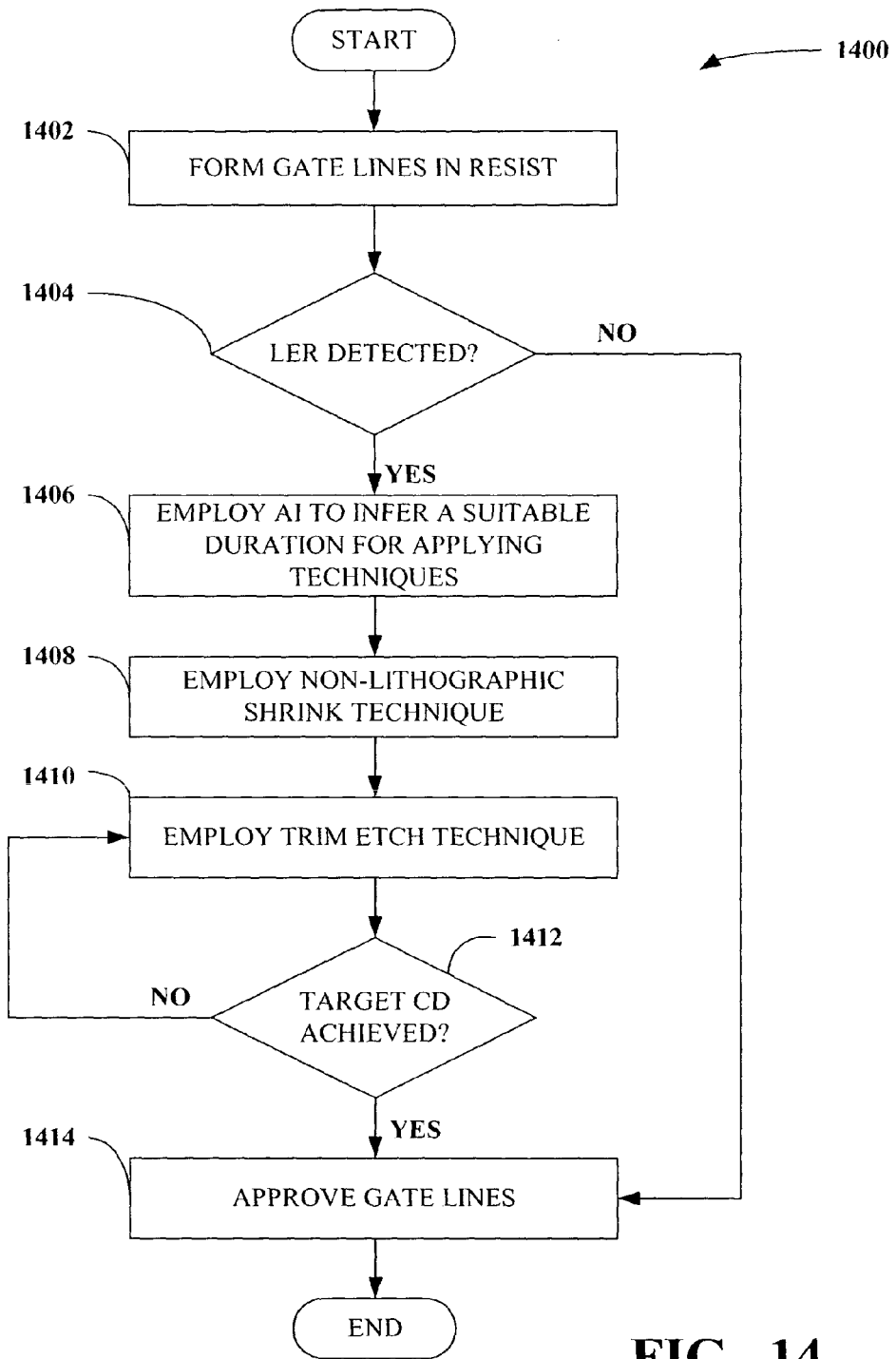
FIG. 14 is an illustration of a flow diagram of a methodology in accordance with an aspect of the present invention.

Turning briefly to FIGS. 12, 13, and 14, methodologies that can be implemented in accordance with the present invention are illustrated. While, for purposes of simplicity of explanation, the methodologies are shown and described as a series of blocks, it is to be understood and appreciated that the present invention is not limited by the order of the blocks, as some blocks can, in accordance with the present invention, occur in different orders and/or concurrently with other blocks from that shown and described herein. Moreover, not all illustrated blocks may be required to implement the methodologies in accordance with the present invention.

FIG. 12 is an illustration of a methodology 1200 in accordance with an aspect of the present invention. Utilizing conventional methods, gate lines are formed in a resist layer on a semiconductor substrate at 1202. The formation of gate lines conforms to a specific target tolerance with regard to a critical dimension. At 1204, the present system makes a determination of the existence of LER on the gate lines. This determination can be made via employing, for example, a monitoring component such as a scanning electron microscope (SEM), a critical dimension SEM (CD-SEM), a scatterometry component, or any other suitable means for detecting, measuring, and/or monitoring LER. If no LER is detected, the method can proceed directly to 1212, where gate line structure is approved. If LER is detected, a non-lithographic shrink technique can be employed to mitigate LER at 1206. The non-lithographic shrink technique can be, for example, a thermal reflow technique, a Resolution Enhancement Lithography Assisted by Chemical Shrink (RELACS™) technique, and/or a Shrink Assist Film for Enhanced Resolution (SAFIER) technique. At 1208, any increase in CD between gates (e.g., change in CD from d1 to d2) resulting from the shrink technique can be mitigated via employing a trim etch technique. At 1210, a determination is made regarding whether the original target CD has been recaptured. If the specified target tolerance for CD has not been achieved, then the method reverts to 1208 to employ another trim etch technique. If the CD measured at 1210 is within a tolerance associated with a target CD value, then the method proceeds to 1212, where gate lines are approved.

FIG. 13 illustrates a flow diagram of a methodology 1300 in accordance with an aspect of the invention. At 1302, gate lines are formed in a resist via a conventional lithographic technique. At 1304, a determination is made regarding whether LER is present. If no LER is detected, the gate lines are approved at 1312. If LER is detected on the gate lines, a thermal flow technique can be employed at 1306 to mitigate LER. At 1308, a trim etch technique can be employed to mitigate any increase in CD that can have resulted from the thermal flow. At 1310, an inquiry is made as to whether the post-trim etch CD is within a tolerance associated with a target CD. If the post-trim etch CD is not within a desired tolerance, the method permits the trim etch to be repeated at 1308. If the target CD tolerance is satisfied at 1310, the gate lines can be approved at 1312.

FIG. 14 is an illustration of a flow diagram of a methodology in accordance with an aspect of the present invention. Gate lines are formed in a resist via a conventional lithographic technique at 1402. At 1404, a determination is made as to whether LER is present. If no LER is detected, the gate lines can be approved at 1414. If LER is detected on the gate lines, the method employs artificial intelligence (AI) techniques at 1406 to infer, for example, a suitable duration for employing a non-lithographic shrink technique at 1408 to mitigate LER. According to another example, AI techniques can be employed to determine a most-suitable non-lithographic shrink technique, such as thermal reflow, RELACS™, SAFIER, etc. At 1410, a trim etch technique is employed to mitigate any increase in CD that can have resulted from the shrink technique. AI techniques can again be employed to facilitate inferences that are germane to determining a correct diffusion period for an applied trimming compound (e.g., an optimal point at which to introduce a developer to effectuate removal of diffused portions of a resist, . . . ). At 1412, an inquiry is made as to whether the post-trim etch CD is within a tolerance associated with a target CD. If the post-trim etch CD is not within a desired tolerance, the method can repeat the trim etch at 1410. If the target CD tolerance is satisfied at 1412, gate lines can be approved at 1414.

Figure 15:
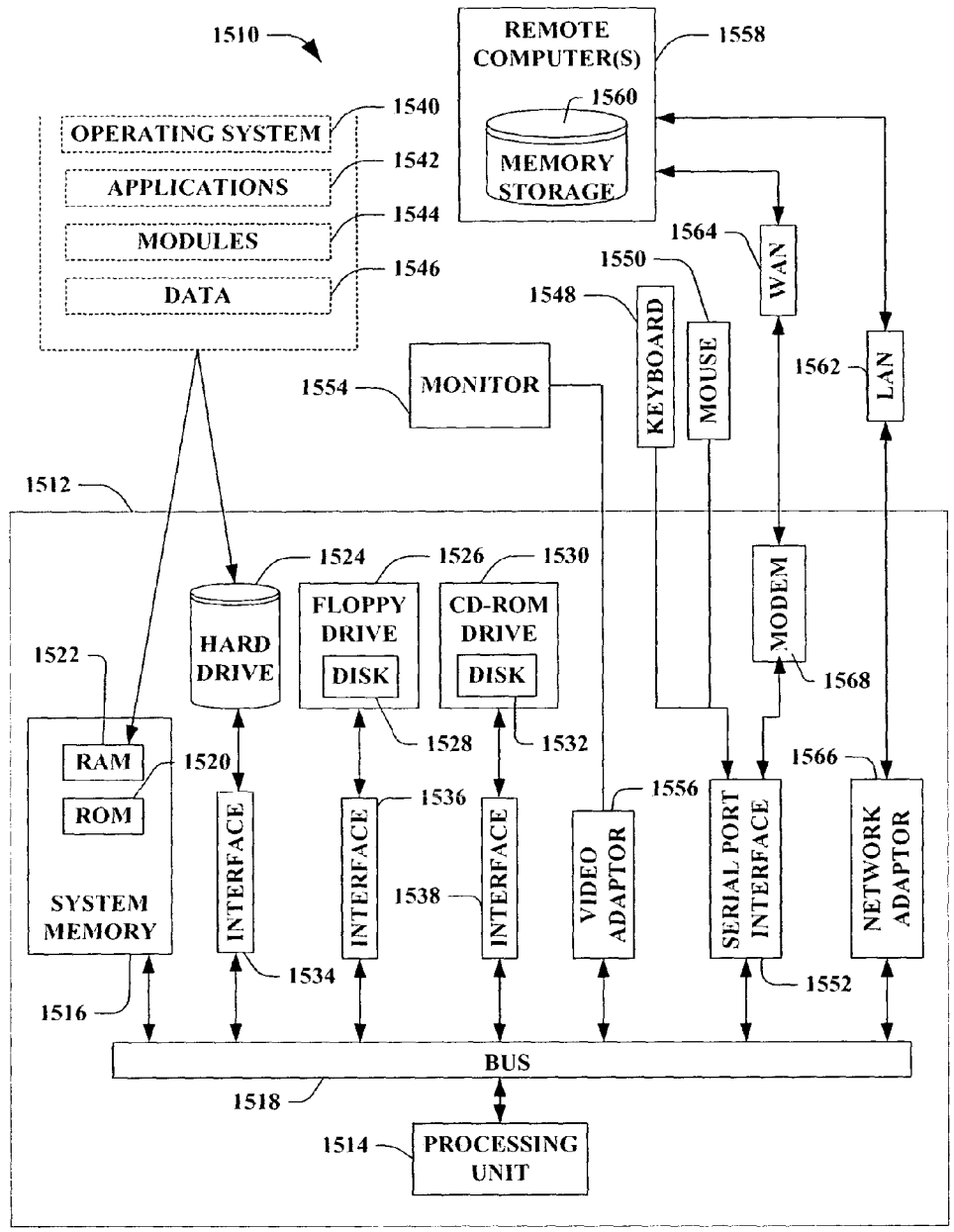
FIG. 15 is an illustration of an exemplary computing system and/or environment in connection with facilitating employment of the subject invention.

FIG. 15 is a schematic block diagram of an exemplary operating environment for a system configured in accordance with the present invention. In order to provide additional context for various aspects of the present invention, FIG. 15 and the following discussion are intended to provide a brief, general description of a suitable computing environment 1510 in which the various aspects of the present invention can be implemented. While the invention has been described above in the general context of computer-executable instructions that can run on one or more computers, those skilled in the art will recognize that the invention also can be implemented in combination with other program modules and/or as a combination of hardware and software. Generally, program modules comprise routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices, microprocessor-based or programmable consumer electronics, and the like, each of which can be operatively coupled to one or more associated devices. The illustrated aspects of the invention can also be practiced in distributed computing environments where certain tasks are performed by remote processing devices that are linked through a communications network. In a distributed computing environment, program modules can be located in both local and remote memory storage devices.

With reference to FIG. 15, an exemplary environment 1510 for implementing various aspects of the invention comprises a computer 1512, the computer 1512 including a processing unit 1514, a system memory 1516 and a system bus 1518. The system bus 1518 couples system components including, but not limited to, the system memory 1516 to the processing unit 1514. The processing unit 1514 can be any of various commercially available processors. Dual microprocessors and other multi-processor architectures also can be employed as the processing unit 1514.

The system bus 1518 can be any of several types of bus structure including a memory bus or memory controller, a peripheral bus and a local bus utilizing any of a variety of commercially available bus architectures. The system memory 1522 comprises read only memory (ROM) 1520 and random access memory (RAM) 1522. A basic input/output system (BIOS), containing the basic routines that help to transfer information between elements within the computer 1512, such as during start-up, is stored in ROM 1520.

The computer 1512 further comprises a hard disk drive 1524, a magnetic disk drive 1526, (e.g., to read from or write to a removable disk 1528) and an optical disk drive 1530, (e.g., for reading a CD-ROM disk 1532 or to read from or write to other optical media). The hard disk drive 1524, magnetic disk drive 1526 and optical disk drive 1530 can be connected to the system bus 1518 by a hard disk drive interface 1534, a magnetic disk drive interface 1536 and an optical drive interface 1538, respectively. The drives and their associated computer-readable media provide nonvolatile storage of data, data structures, computer-executable instructions, etc. for the computer 1512, including for the storage of broadcast programming in a suitable digital format. Although the description of computer-readable media above refers to a hard disk, a removable magnetic disk and a CD, it should be appreciated by those skilled in the art that other types of media which are readable by a computer, such as zip drives, magnetic cassettes, flash memory cards, digital video disks, cartridges, and the like, can also be used in the exemplary operating environment, and further that any such media can contain computer-executable instructions for performing the methods of the present invention.

A number of program modules can be stored in the drives and RAM 1522, including an operating system 1540, one or more application programs 1542, other program modules 1544 and program data 1546. It is to be appreciated that the present invention can be implemented with various commercially available operating systems or combinations of operating systems.

A user can enter commands and information into the computer 1512 through a keyboard 1548 and a pointing device, such as a mouse 1550. Other input devices (not shown) can comprise a microphone, an IR remote control, a joystick, a game pad, a satellite dish, cameras, in the sense of gesture interpreted through cameras and machine-vision software, a scanner, or the like. These and other input devices are often connected to the processing unit 1514 through a serial port interface 1552 that is coupled to the system bus 1518, but can be connected by other interfaces, such as a parallel port, a game port, a universal serial bus ("USB"), an IR interface, etc. A monitor 1554 or other type of display device is also connected to the system bus 1518 via an interface, such as a video adapter 1556. In addition to the monitor, a computer typically comprises other peripheral output devices (not shown), such as speakers, printers etc.

The computer 1512 can operate in a networked environment utilizing logical connections to one or more remote computers, such as a remote computer(s) 1558. The remote computer(s) 1558 can be a workstation, a server computer, a router, a personal computer, microprocessor based entertainment appliance, a peer device or other common network node, and typically comprises many or all of the elements described relative to the computer 1512, although, for purposes of brevity, only a memory storage device 1560 is illustrated. The logical connections depicted comprise a local area network (LAN) 1562 and a wide area network (WAN) 1564. Such networking environments are commonplace in offices, enterprise-wide computer networks, intranets and the Internet.

When used in a LAN networking environment, the computer 1512 is connected to the local network 1562 through a network interface or adapter 1566. When used in a WAN networking environment, the computer 1512 typically comprises a modem 1568, or is connected to a communications server on the LAN, or has other means for establishing communications over the WAN 1564, such as the Internet. The modem 1568, which can be internal or external, is connected to the system bus 1518 via the serial port interface 1552. In a networked environment, program modules depicted relative to the computer 1512, or portions thereof, can be stored in the remote memory storage device 1560. It will be appreciated that the network connections shown are exemplary and other means of establishing a communications link between the computers can be used.

What has been described above comprises examples of the present invention. It is, of course, not possible to describe eatery conceivable combination of components or methodologies for purposes of describing the present invention, but one of ordinary skill in the art can recognize that many further combinations and permutations of the present invention are possible. Accordingly, the present invention is intended to embrace all such alterations, modifications and variations that fall within the spirit and scope of the appended claims. Furthermore, to the extent that the term "comprises" is used in either the detailed description or the claims, such term is intended to be inclusive in a manner similar to the term "comprising" as "comprising" is interpreted when employed as a transitional word in a claim.

What is claimed is:

1. A system for mitigating line-edge roughness on a semiconductor device, comprising:
   a monitoring component that monitors information associated with an original distance of a photoresist and line-edge roughness on a photoresist;
   a non-lithographic shrink component comprising at least one of a chemical component, a shrink enhancement component that shrinks a gate channel, or a thermal component that applies heat to the photoresist to a point for causing the photoresist to just enter a liquid phase to mitigate line-edge roughness, which in turn increases a distance between gates and decreases a thickness of the photoresist layer; and
   a trim etch component is utilized to mitigate the increased distance between the gates by removing excess resist material resulting from the non-lithographic component so as to restore the original distance of the photoresist.

2. The system of claim 1, the monitoring component comprising at least one of a scatterometry system and a Scanning Electron Microscopy system.

3. The system of claim 1, further comprising a processor that processes data associated with the an original distance of a photoresist and line-edge roughness on a photoresist.

4. The system of claim 3, the processor comprising an artificial intelligence component that facilitates making inferences regarding mitigating line-edge roughness on a photoresist and restoring an original distance of a photoresist.

5. The system of claim 4, the artificial intelligence component comprising at least one of a support vector machine, a neural network, an expert system, a Bayesian belief network, fuzzy logic, and a data fusion engine.

6. The system of claim 1, further comprising a memory component that stores data associated with mitigating line-edge roughness on a photoresist and restoring an original distance of a photoresist.

7. The system of claim 6, the memory component comprising at least one of volatile and non-volatile memory.

8. A method for mitigating line-edge roughness on a semiconductor device, comprising:
   determining whether line-edge roughness is extant on a patterned photoresist;
   employing a non-lithographic shrink technique comprising at least one of a chemical technique, an expansion technique, a shrink enhancement technique that shrinks a gate channel, or a thermal technique to heat a photoresist to a point for causing the photoresist to just enter a liquid phase to mitigate line-edge roughness, which in turn increases a distance between gates and decrease a thickness of the photoresist layer; and
   employing a trim etch technique to mitigate the increased distance between the gates by removing excess resist material resulting from the non-lithographic component so as to restore an original distance of the photoresist.

9. The method of claim 8, further comprising processing information associated with photoresist line status.

10. The method of claim 8, further comprising making inferences regarding photoresist line status.

11. The method of claim 8, further comprising storing information associated with photoresist line status.

12. The method of claim 8, the presence of line-edge roughness is determined via employing at least one of a scatterometry technique and Scanning Electron Microscopy.

13. The method of claim 8, further comprising generating feedback data that facilitates controlling at least one parameter associated with at least one of line-edge roughness mitigation and critical dimension maintenance.

14. The method of claim 8, the trim etch technique recaptures an original target critical dimension, the original target critical dimension extant on the photoresist before employing the non-lithographic shrink technique.

15. A system for mitigating line-edge roughness on a semiconductor device, comprising:
    means for determining critical dimensions and line-edge roughness on a photoresist;
    means for employing a non-lithographic shrink technique comprising at least one of a chemical technique, an expansion technique, a shrink enhancement technique that shrinks a gate channel, or a thermal technique to heat a photoresist to a point for causing the photoresist to just enter a liquid phase to mitigate line-edge roughness, which in turn increases a distance between gates and decreases a thickness of the photoresist layer; and
    means for removing excess resist material resulting from the non-lithographic shrink technique to restore an original distance of the photoresist.

16. The system of claim 15, further comprising means for monitoring photoresist line status.

17. The system of claim 15, further comprising means for processing information associated with photoresist line status.

18. The system of claim 15, further comprising means for storing information associated with photoresist line status.

19. The system of claim 15, further comprising means for making inferences related to photoresist line status.

20. The system of claim 15, the means for mitigating line-edge roughness comprising means for performing a non-lithographic technique.

21. The system of claim 15, the means for trimming excess resist material comprising means for performing a trim etch.

* * * * *